(12) United States Patent
Occleppo (10) Patent No.: US 6,485,620 B1
(45) Date of Patent: Nov. 26, 2002

(54) DEVICE FOR ELECTROPLATING ON TRANSLATING METAL SHEETS, ESPECIALLY FOR PRINTED CIRCUITS, BY CLOSURE OF AN ELECTRIC CIRCUIT BETWEEN THE SHEETS AND A LIQUID REACTANT PRODUCT

(75) Inventor: Francesco Occleppo, Milan (IT)

(73) Assignee: Occleppo di Francesco Occleppo & C.S.N.C., Alice Castello (IT)

(*) Notice: Subject to any disclaimer, the term of this patent is extended or adjusted under 35 U.S.C. 154(b) by 0 days.

(21) Appl. No.: 09/530,078

(22) PCT Filed: Feb. 11, 1998

(86) PCT No.: PCT/IT98/00021
§ 371 (c)(1),
(2), (4) Date: Apr. 20, 2000

(87) PCT Pub. No.: WO99/36598
PCT Pub. Date: Jul. 22, 1999

(30) Foreign Application Priority Data

Jan. 19, 1998 (IT) .......................... MI98A0080

(51) Int. Cl.[7] .............................................. C25D 17/00
(52) U.S. Cl. ...................................... 204/198; 204/202
(58) Field of Search ........................... 204/198, 224 R, 204/202, 206

(56) References Cited

U.S. PATENT DOCUMENTS 4,377,461 A * 3/1983 Lovejoy ..................... 204/198
4,394,241 A * 7/1983 Scanlon ...................... 204/198
4,421,624 A * 12/1983 Kimoto et al. .............. 204/209
6,153,064 A * 11/2000 Condra et al. .............. 204/198
6,238,529 B1 * 5/2001 Geissler et al. ............. 204/202

FOREIGN PATENT DOCUMENTS

DE           35 03 856 A        8/1987

* cited by examiner

Primary Examiner—Nam Nguyen
Assistant Examiner—Erica Smith-Hicks
(74) Attorney, Agent, or Firm—Michael J. Striker (57) ABSTRACT

Device (60) having one or more operative units (55) for electroplating a film by chemical reaction with a specially made liquid product (29) and application of direct current, on sheets (50) for printed circuits continuously translating between one or more pairs of opposing oblong chambers (210, 130) respectively supplied with tubular nozzles (231) and with one longitudinal slit nozzle (233) and having internal electrodes (220, 240) electrically connected to the negative pole of a generator of direct current, between one or more pairs of titanium contact rollers (61–62, 130–131), electrically connected to the positive pole of the current, and plastic containment rollers (100–101, 110–111) of the liquid (29) rotating in each pair reciprocally in opposite directions, due to closure of the electric circuit between the liquid product (29), pumped in under pressure by the pump and projected by the nozzles (213, 233) of the chambers (210, 230) against the sheets (50), and said sheets through the contact rollers.

14 Claims, 5 Drawing Sheets

DEVICE FOR ELECTROPLATING ON TRANSLATING METAL SHEETS, ESPECIALLY FOR PRINTED CIRCUITS, BY CLOSURE OF AN ELECTRIC CIRCUIT BETWEEN THE SHEETS AND A LIQUID REACTANT PRODUCT

BACKGROUND OF THE INVENTION

The invention concerns equipment and automatic systems for electro-plating on metal sheets especially for the production of printed circuits.

To apply a protective or antioxidant film to the sheets or in any case a film designed to improve their quality, the sheets are immersed in a special bath. The components of the bath cause chemical reactions on the metal surface, especially on copper, producing a film of what is known as chemical tin, or chemical copper as the case may be, or other products.

For large-scale production specially devised mechanical means of transport pass the sheets through the bath one after another.

The procedure, based on a chemical reaction associated to the action of gravity, obviously takes considerable time partly because of the need to obtain an even film.

SUMMARY OF THE INVENTION

Purpose of the above invention is to shorten working times while ensuring optimum formation of the film on the sheets as will now be explained. Subject of the invention is a device, in a plant for electoplating a film on metal sheets, especially for printed circuits, translating continuously, parallel one to another, using special transporting means.

This device presents, in succession, one or more operative units each comprising one or more pairs of metal rollers, here called contact rollers, carrying along in axial rotation by mechanical means, reciprocally in the opposite direction, sealed oblong chambers, placed above the trajectory of the translating sheets, having a series of tubular nozzles with coplanar axes substantially side by side and parallel, provided with an internal oblong laminar electrode, a pump that continuously takes up a special liquid product recycled from a bath underneath and pumps it under pressure into said chambers, the device being connected to an electric-electronic drive unit which, in accordance with a specially devised program, controls and operates the movement of said rollers, action of the pump, translation of the sheets and generation of direct electric current.

Said pairs of rollers and said chambers are placed transversally to the direction of translation of the sheets.

The electrode inside the sealed chamber and said contact rollers are reciprocally electrically insulated and respectively connected to the two poles of said direct current.

As the sheets pass between the pairs of contact rollers the liquid pumped into the chamber is projected through the nozzles onto the areas of the sheets while these emerge from said rollers.

It follows that, due to the effect produced by closure of the electric circuit generated by the DC current between the liquid and the sheets, these latter become electro-plated as desired.

After the pair of contact rollers and before the oblong chamber, bearing in mind the direction of movement, each operative unit comprises, in succession, a first pair of rollers, here called containment rollers, resting laterally one above another and drawn along in axial rotation, reciprocally opposingly directed, by mechanical means.

The upper roller is surrounded by a number of substantially equal rings placed side by side, whose internal diameter is considerably larger than the diameter of said upper roller.

Associated to said first oblong chamber with tubular nozzles is a second oblong chamber opposite to the first and placed below the trajectory of the translating sheets.

Said second chamber is substantially similar to the first one but, instead of tubular nozzles, it has a nozzle with a narrow longitudinal slit in it substantially opposite to the set of nozzles of the chamber above and extending to the same length as that of said set.

The second chamber is also supplied by the pump with recycled liquid from the bath below, and has inside it a laminar oblong electrode connected to the same electric pole to which the electrode of the first chamber is connected.

After said pair of chambers there is a second pair of containment rollers substantially equal to the first pair.

The upper chamber is placed higher than the upper rollers comprised in the two pairs of containment rollers.

The lower chamber is placed lower than the axis of the lower rollers of said two pairs of containment rollers.

The level and reciprocal distance of the longitudinal edges of the upper faces of said lower chambers are such as will ensure contact between the surfaces of said lower rollers and said edges thus forming a kind of intermediate channel comprising a base, formed of the upper face of said lower chambers, and sides formed of the opposite surfaces of said lower rollers forming the two pairs of containment rollers.

Said channel therefore becomes filled with the liquid that emerges under pressure through the slit nozzle for the lower chambers.

When the rings of the upper rollers in said pairs of containment rollers spontaneously rest on the surfaces of the advancing sheets, they sub stantially form a channel whose base is formed by the advancing sheets and whose side walls are formed by the external surfaces of said rings.

This channel too fills up with active liquid from the nozzles of said upper chambers.

Each operative unit advantageously comprises, between the pairs of contact and containment rollers, a freely turning pair of rollers here called finishing rollers.

The rollers of each pair are respectively served by supports formed of rectangular recesses made in the opposite sides of the framework of the installation into which recesses the pins and cylindrical extensions to the two ends of said rollers can fit.

Due to its own weight, therefore, the upper roller of each pair of rollers bears on the lower roller and consequently on the metal sheets when they pass between said rollers.

The mechanism that rotates the pair of contact rollers comprises gear wheels fixed to the ends of the lower rollers of the pair, said gears meshing with a continuous chain placed orthogonally to said rollers and driven by an electric motor.

The rollers of each pair are linked by substantially similar gear wheels.

Even though the upper roller in the pair of contact rollers is slightly separated from the lower one by passage of the metal sheets, its rotation is assured by the length of the teeth of the gear wheels, these being considerably longer than the thickness of said sheets.

The mechanism that causes rotation of the pair of containment rollers comprises helical gear wheels fixed to the opposite ends (in relation to the ends of the contact rollers) of the lower rollers in the pair, these gears meshing with the helical gear wheels fixed to a motor driven shaft orthogonal to said rollers.

The two rollers of each pair are linked by substantially equal helical gear wheels.

The contact rollers and the laminar electrodes placed inside the sealed chambers are respectively connected electrically to the negative and positive poles of the direct current.

Should it be required to have electro-plating on oblong sheets with raised edges of plastic material, the contact finishing and containment rollers are made with annular bands, of a width corresponding to that of said oblong sheets, between said edges and projecting above the height of said edges on both faces of said sheets.

The dimensions of the rings round the containment rollers and of the internal and external diameters, as well as width, are calculated to allow them to settle spontaneously both on the faces of the sheets and on the raised edges.

The film may be of chemical tin or of chemical copper or may possess other characteristics.

The contact rollers are advantageously of titanium.

The finishing and containment rollers and the rings round said latter rollers are advantageously of plastic material.

The invention offers evident advantages. By closure of the direct current electric circuit between the active liquid, receiving a polarity from the electrodes in the sealed chambers with nozzles, and the sheets receiving the second polarity from the titanium rollers, deposition times of the particles in the liquid and of the chemical reactions that form the film on both faces of the sheets are greatly accelerated.

All this is accompanied by a reduction in the costs of manufacturing printed circuits especially, and by a considerable improvement in quality.

Characteristics and purposes of the disclosure will be made still clearer by the following examples of its execution illustrated by diagrammatically drawn figures.

DESCRIPTION OF THE PREFERRED EMBODIMENTS

Figure 1:
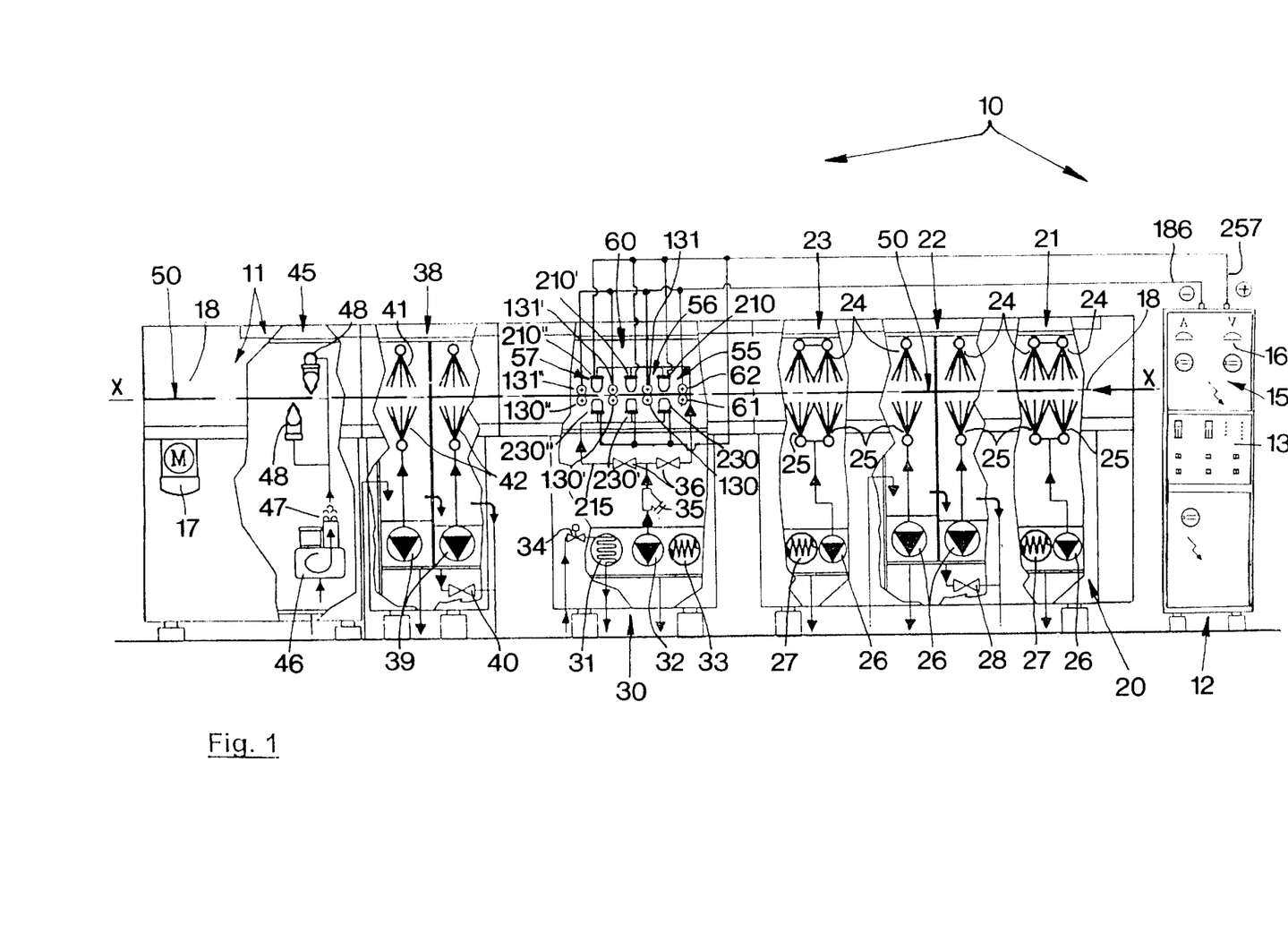
FIG. 1 Installation showing the device subject of the invention for electro-plating in line, on metal sheets especially for printed circuits, with a number of operative units, side view.

The installation 10 with framework 11 for electro-plating on sheets, especially for printed circuits, in movement, is programmed and operated by an electric-electronic drive unit 12 with control panel 13, comprising a current rectifier 15 with control panel 16 that supplies low voltage direct current, and the motor 17 for translation of the sheets 50.

The installation comprises a channel 18 within which the sheets 50 move on a horizontal plane XX and, in succession, four groups, for preparation 20, for electro-plating 30, for washing 38 and for drying 45.

The preparation group 20 comprises the degreasing stations 21, washing stations 22 and pickling stations 23.

Said stations exhibit a series of upper 24 and lower 25 nozzles, the pumps 26, heat generators 27 and valves 28.

The electro-plating group 30 comprises a device 60, subject of the invention, the heat generator 33, pump 32, cold generator 31, solenoid valve 34, impurity collecter 35 and valves 36.

The washing group 38 comprises a set of upper nozzles 41, lower nozzles 42, pumps 39 and valves 40.

The drying group 45 comprises a blower 46, fume chimney 47 and a series of nozzles 48 for drying the sheets 50.

The electro-plating device 60 comprises a series of operative units, like 55–57, these in turn (as shown in unit 55 in FIG. 4) comprising a pair of titanium rollers, called contact rollers, an upper one 62 and a lower one 61, a pair of rollers, here called finishing rollers, an upper one 91 and a lower one 90 of plastic material and a pair of rollers, here called containment rollers, a lower one 100 and an upper one 101 of plastic material.

Figure 4:
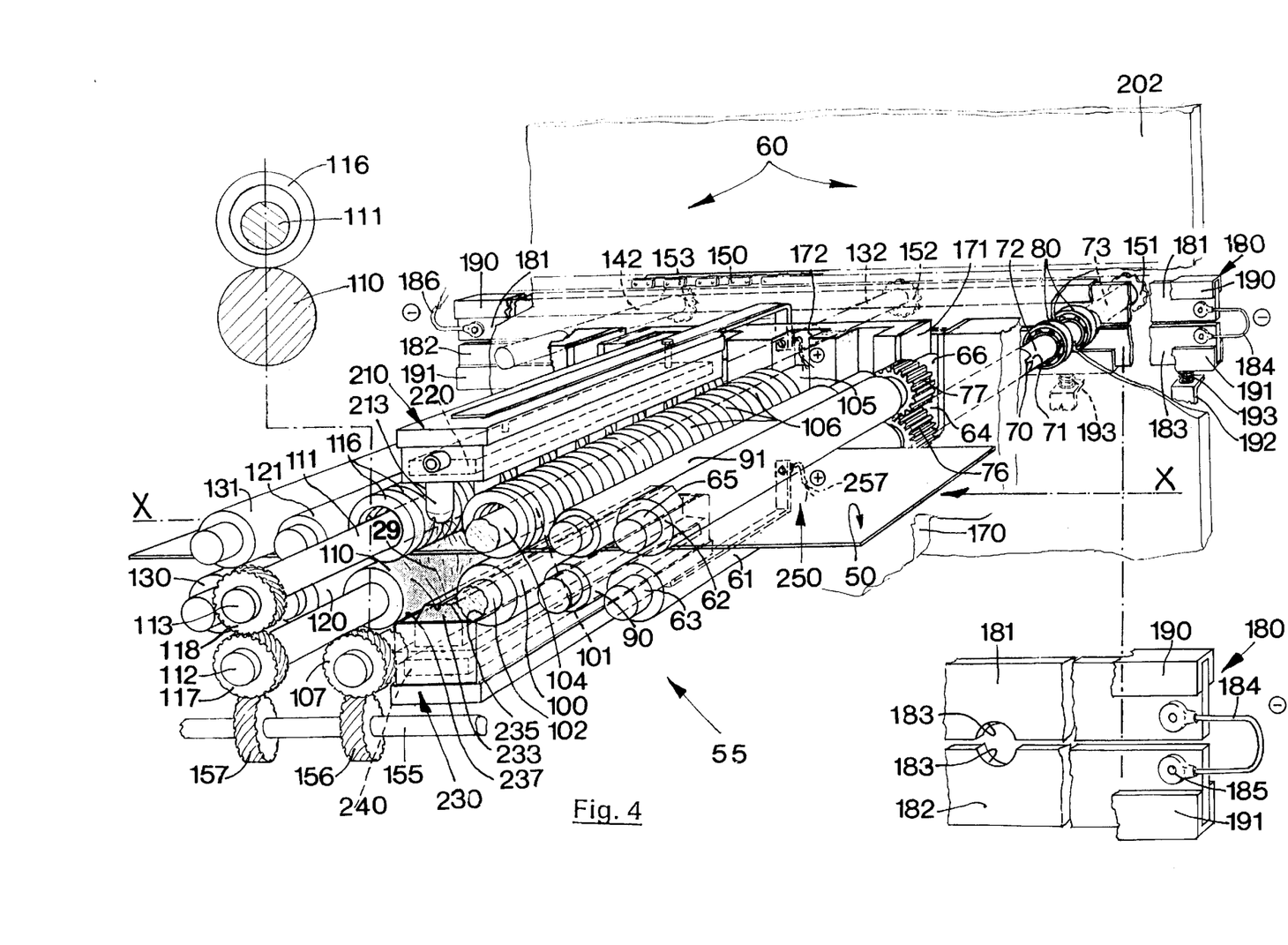
FIG. 4 Detail of an operative unit, lateral perspective from above.

The upper roller 101 of the pair of containment rollers 100 and 101, is surrounded by a series of containment rings 106 free to rotate on said roller, their internal diameter being substantially greater than the external diameter of said roller 101.

At a certain horizontal distance from the pair of containment rollers 100 and 101, there is a second substantially equal pair of containment rollers comprising an upper roller 111 and a lower roller 110

The upper roller is surrounded by a number of rings 116 substantially equal to the rings 106.

Downstream of said second pair of containment rollers is a second pair of finishing rollers 120 and 121

Downstream of said second pair of finishing rollers is a second pair of contact rollers 130 and 131.

Said electro-plating device 60 presents two opposing sides 201, 202, inside of which are the opposing plates 160 and 170 that support the rollers of the operative units like the one already described.

The upper roller 62 of the first pair of contact rollers has two pins 65 and 66 at its two ends.

The lower roller 61 of said pair presents the pin 63 at one end and at the other end a pin 64 that extends nearly as far as the side 202 and has at one end the axial slot 70 for insertion of the tongue 71 of a short shaft 72 supported by roller bearings 80 placed in said side 202.

The pin 63 and the initial part of pin 64 freely penetrate inside the substantially rectangular seats 161 and 171 made in the opposing support plates 160 and 170 referred to above.

The pins 65 and 66 of the upper roller of said pair of contact rollers are similarly lodged in said seats 161 and 171 in which they can freely slide.

The upper roller 62 therefore weighs on the lower roller 61 while allowing free passage between them for the translating sheets 50.

The containment rollers 100 and 101 respectively present pins 102 and 103, pin 105 and the extension 104 of the upper roller 101.

Said pins 102, 103, 105 and said extension 104 freely penetrate inside the substantially rectangular seats 162, 172, made in the support plates 160 and 170.

The pins on the lower roller 100 are supported by the base of said seats 162 and 172 while the pins 104 and 105 of the upper roller 101 can slide freely inside said seats 162 and 172.

Fixed to the extension 73 of the shaft 72, mounted on the lower roller 61 of the pair of contact rollers 61 and 62, is a gear wheel 151 that meshes with the continuous chain 150 moved by an electric motor not shown in the figures for the sake of simplicity.

The gear wheel 76 is mounted on the pin 64 of said roller 61, this gear wheel meshing with the gear wheel 77 mounted on pin 66 of the upper roller 62 of said pair of rollers 61 and 62.

Said roller 62 is therefore made to rotate by the roller 61.

As the upper roller 62 freely gravitates on the lower roller 61 and allowing for the length of the teeth on the gear wheels 76 and 77, rotation of said rollers makes possible free passage of the thin metal sheet 50 to be electro-plated.

The other pairs of contact rollers, like 130, 131 and others, are similarly made to rotate by the gear wheels 152, 153 and others that mesh with the continuous chain 150 already mentioned, fixed to the extended pins 132 and 142 of the lower rollers of the pair of contact rollers such as 130 and others.

At one end 102 of the lower roller 100 of the pair of containment rollers 100 and 101, is the gear wheel 107 with helical teeth that meshes with the helically toothed wheel 156 on the shaft 155 orthogonal to said rollers and parallel to the trajectory followed by the metal sheets.

The gear wheel 108 is mounted on the pin 104 of the upper roller 101 of said pair and is substantially the same as gear wheel 107 with which it meshes. Rollers 100 and 101 therefore rotate in opposite directions.

The other pairs of containment rollers, like 110 and 111, are similarly made to rotate by the gear wheels 117 and 118 respectively fixed to the ends 112 and 113 of said rollers, and by gear wheel 157 fixed to the shaft 155.

Placed between the second pair of containment rollers and the second pair of contact rollers is a second pair of finishing rollers 120 and 121.

Extensions 73 to the short shafts 72 rotate inside grooves 183 in the opposing bars 181 and 182 supported by U-shaped pieces 190 and 191 forming part of the electrical unit 180.

The two bars 181, 182 are electrically and mechanically connected by a flexible U-bolt 184 fixed by means of tabs 185.

Bar 182 is pressure mounted against said extensions 73 to shafts 72 by the compression springs 193 placed between the supports 192, fixed to the frame of the plant, and the U-shaped piece 191.

Bar 181 presses with its weight on said extensions 73 strengthening contact thereby, and is electrically connected by the wire 186 to the generator 15 of direct current.

Placed between the two pairs of containment rollers, respectively 100–101 and 110–111, are oblong opposing sealed chambers, an upper chamber 210 and a lower chamber 230, with parallelepiped body 211 and covers 212 and 232.

On its lower face opposite the translating metal sheets, the chamber 210 has the tubular nozzles 213.

Said chamber communicates with the pump 32 through the beak 214 and a suitable connecting tube 215, and is supported by the vertical plate 202 by means of the horizontal metal bracket 251 with ends 252 at 900.

Said bracket is connected to the oblong electrode 220, placed inside said chamber, by bolts 221 and nuts 222 and 223.

The end 252 of the bracket 251 is fixed to the metal sides 202 of the frame 11 of the installation, by means of a bolt 255, bushing 253 and insulating washer 254.

The electrode 220 can therefore be connected to the generator 15 of direct current by wire 257 thus forming the electrical unit 250.

The chamber 230 is substantially the same as the chamber 210 except that, instead of the tubular nozzles 213, there is a longitudinal nozzle 233 having in it a slit 236, said nozzle extending for practically the whole length of the series of nozzles 213 for the upper chamber 21 0, and being substantially in line with said upper nozzles.

On the upper plane of chamber 230, facing towards the metal sheets that translate above it, are edges 235 and 237 that remain substantially in contact with the surfaces of the lower containment rollers 100 and 110 in the pairs of containment rollers 100–101 and 110–111.

It will be clear from the above how the electro-plating device works.

As seen in FIG. 1, said electro-plating device comprises a set of operative units 55–57 like unit 55 described in more detail.

Said operative units 55–57 are seen in diagrammatic form in the general FIG. 1 of the installation with only the first pair of contact rollers, like 61 and 62, of sealed chambers 210 and 230, the second pair of contact rollers like 130 and 131, a second pair of chambers 210' and 230', a third pair of contact rollers 130' and 131', a third pair of sealed chambers 210" and 230" and a fourth pair of contact rollers 130" and 131".

Figure 2:
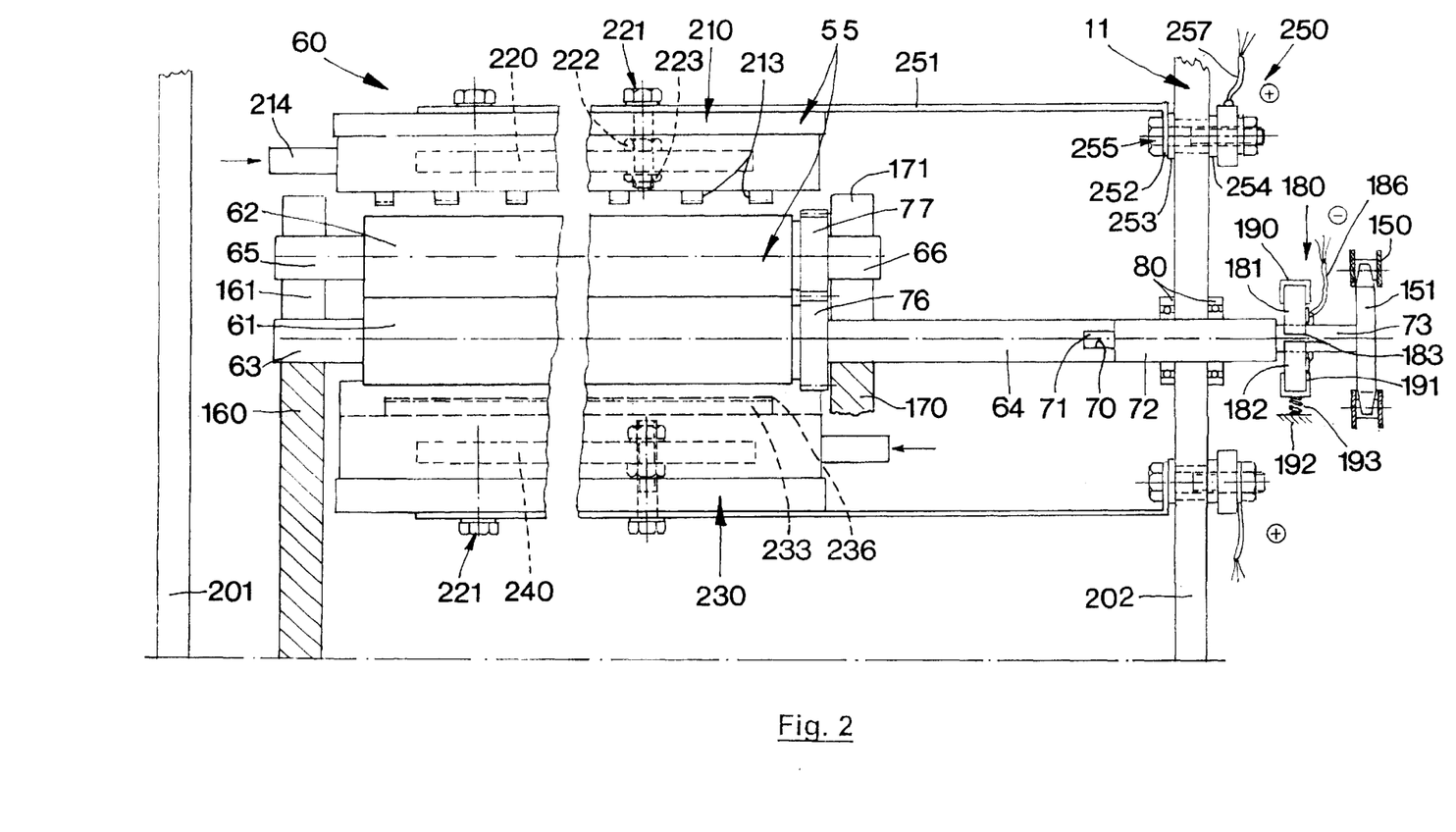
FIG. 2 Cross section of the device upstream of a first operative unit.
Figure 3:
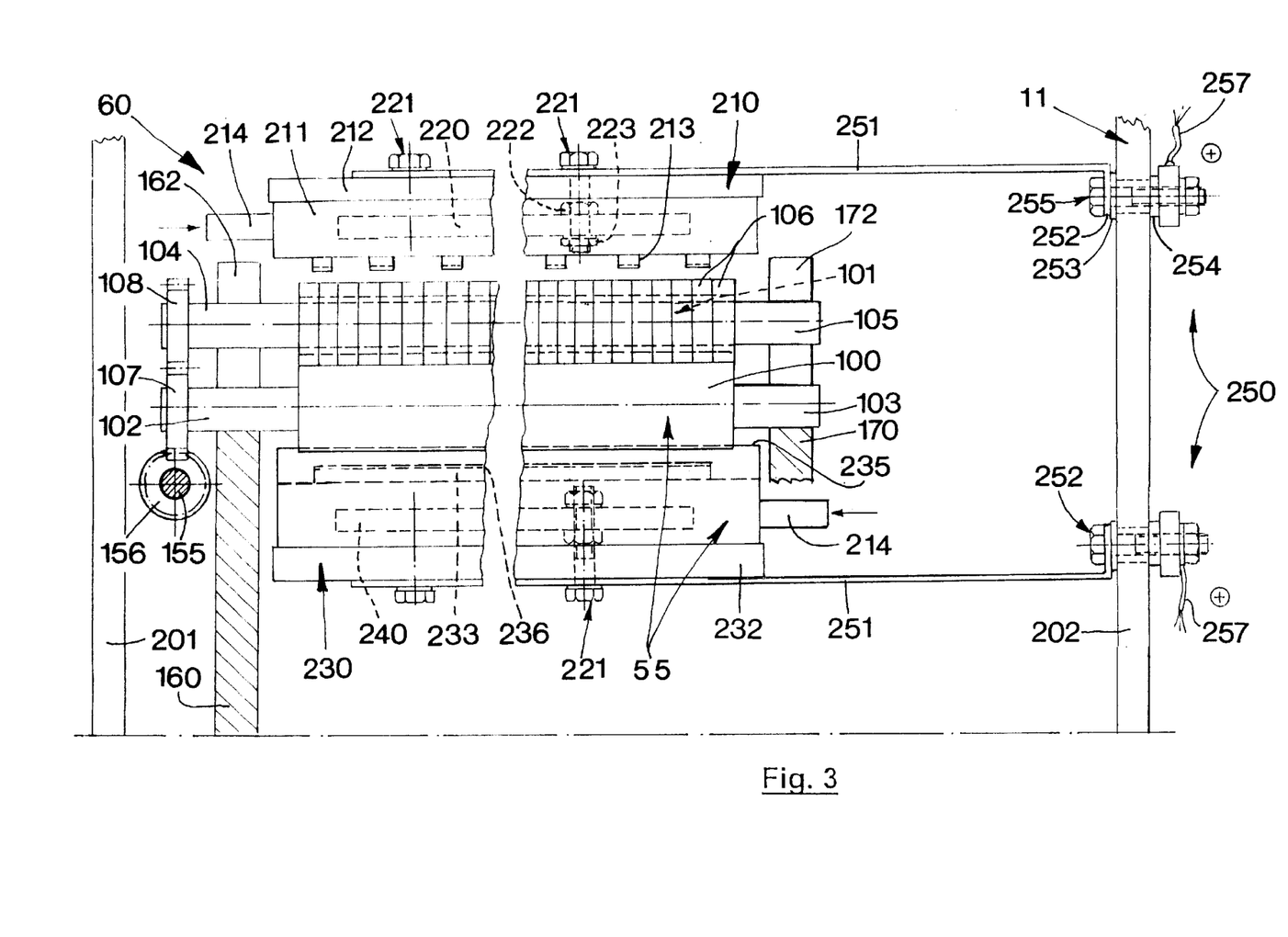
FIG. 3 Cross section of the device upstream of the containment rollers of said operative unit.

The sheets 50 that move along line XX towards the first operative unit 55, pass, as also seen in FIGS. 2–4, between the rollers 61, 62 of the first contact pair, between rollers 90, 91 of the first finishing pair, between rollers 100 and 101 of the first containment pair, by action respectively of the active liquid 29 emitted from above by the tubular nozzles 213 of the sealed chamber 210, and from below through the nozzle with slit 233, of the first pair of sealed chambers, between the rollers of the second pair of containment rollers 110 and 111, between the rollers of the second pair of finishing rollers 120 and 121, between the rollers of the second pair of contact rollers 130 131 and then by action from the successive operative units such as 56 and 57.

Between the lower rollers of the pair of containment rollers 100, 110, placed either side of the pair of sealed chambers, such as 210 and 230, due to contact between the longitudinal raised edges 235 and 237 of the lower chamber and the surfaces of said lower rollers 100 and 110, a lower channel is formed in practice bounded by the lower plane (of the lower sealed chamber), by the surfaces of the aforesaid two lower rollers and by the advancing sheets 50, which channel, fed by the liquid emitted especially by the nozzle 233 with a slit 236 in it, is kept full of active liquid 29 thus helping to reinforce the electro-plating action under the sheet 50.

Between the upper rollers of the pairs of containment rollers, surrounded by the rings 106 and 116 and the sheets that pass between said pairs of rollers, due to presence of said rings, that maintain contact with the upper face of the advancing sheets 50, a sort of upper channel is created the base being formed by the advancing sheets and the walls by the external surfaces of the rings 106, 116 on said upper rollers, which channel, fed through the nozzles 213 of the upper chamber, is kept full of active liquid emitted by said nozzles.

The electric unit 180, formed of the bars 181 and 182 electrically connected to the pairs of titanium rollers 60 and 61, 130 and 131 and successive ones, is connected to the negative pole of the generator 15 of direct current while the active liquid, pumped under pressure by the pump 32 into the pairs of sealed chambers 210 and 230 and successive ones becomes charged, due to electrodes 220 and 240, as a consequence of connection of the electric unit 250 comprising said electrodes, to the positive pole of said generator 15 of direct current.

Electro-plating is thus made more effecient by the synergetic and interacting effect of the projection of active liquid on both faces of the advancing sheets, by formation of a volume of said liquid both below and above said sheets and by closure of the electric circuit between said active liquid and the sheets 50 electrically charged by the titanium contact rollers 61 and 62 and by the others described.

Figure 5:
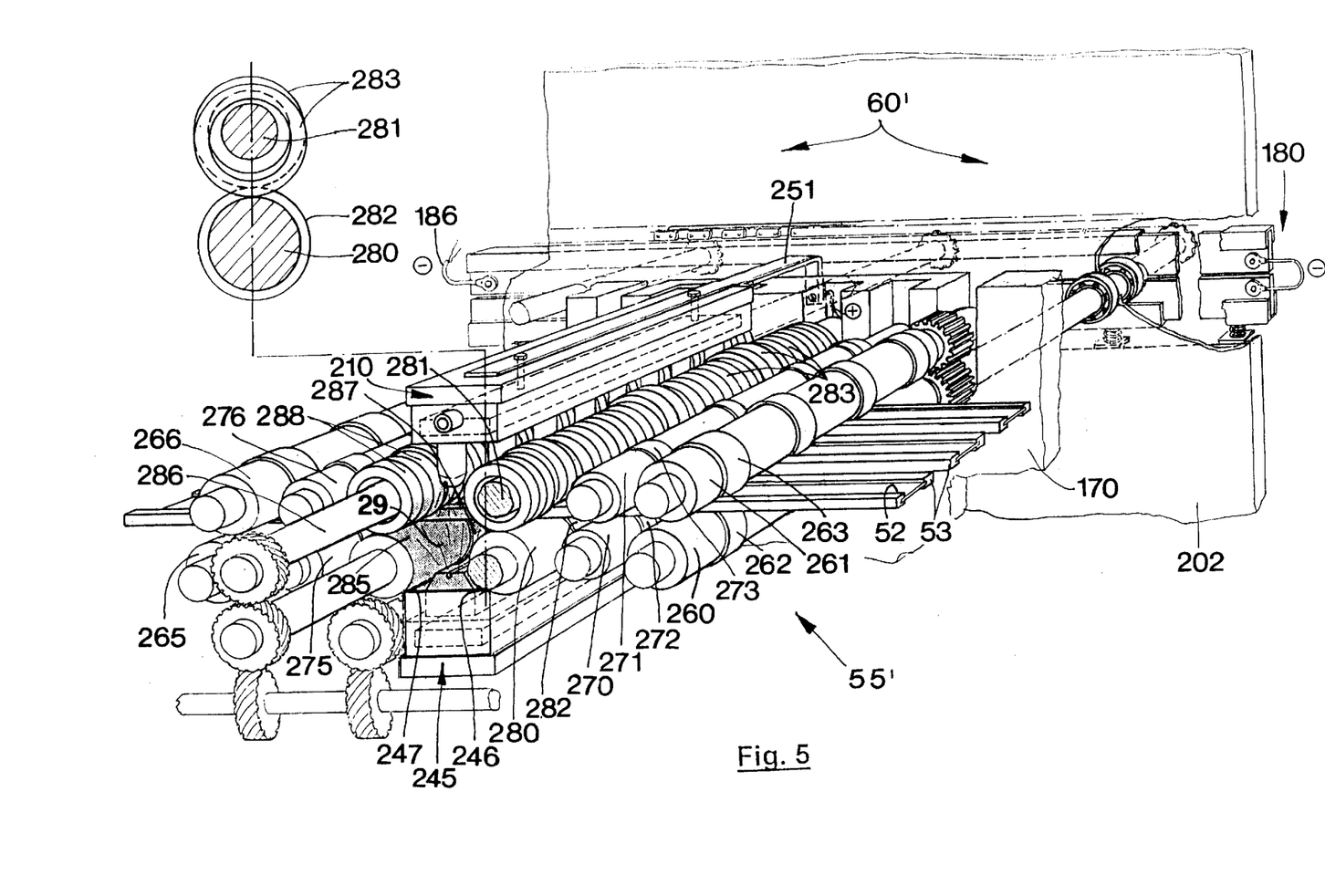
FIG. 5 Detail of an operative unit in a different version for oblong metal sheets with raised edges of plastic material.

FIG. 5 illustrates a variant of the operative units appropriate for electro-plating on oblong sheets 52 to whose longitudinal edges the plastic strips 53 have been applied so making ridges on the two faces of said sheets.

The operative units described are varied by replacing the pairs of rollers described with others provided with raised bands of a width corresponding to the width of the sheets between the ridges and of a height greater than the thickness of said ridges on said oblong sheets 52. FIG. 5 shows said new operative units.

The first pair of lower 260 and upper 261 contact rollers respectively carry the raised bands 262 and 263.

The lower 270 and upper 271 finishing rollers respectively carry raised bands 272 and 273.

The lower 280 and upper 281 containment rollers respectively carry the raised bands 282 and the rings 283.

The second pair of lower 285 and upper 286 containment rollers respectively carry the raised bands 287 and the rings 288.

Said rings are suitably sized to pass between the raised edges of each sheet for contact both with the faces of said sheets and with said ridges.

The second pair of finishing rollers 275, 276 and the second pair of contact rollers 265, 266 carry the raised bands already described.

Placed between the pairs of containment rollers is the pair of sealed chambers with upper nozzle 210 and lower nozzle 245.

The upper plane of said lower chamber has longitudinal edges 246 and 247 shaped to fit with containment rollers 280 and 285.

Optimum electro-plating can therefore be carried out as for the flat sheets.

What is claimed is:

1. A device in an installation for electro-plating a film on metal sheets in a continuous translation through a channel by a transporting means, wherein the transporting means are positioned in parallel and said electroplating effected by means of a chemical reaction with a liquid product characterized in that the device comprises:

one or more operative units each comprising one or more pairs of metal contact rollers resting laterally one above another through which the said sheets translate and wherein said contact rollers are drawn along in axial rotation reciprocally in opposite directions by means of a mechanism, and one or more oblong sealed chamber(s)forming a first sealed chamber, positioned above a trajectory followed by the said sheets, wherein the said oblong sealed chamber(s)are provided with an internal oblong electrode and a pump, said pump comprising a set of tubular nozzles with coplanar axes side by side and parallel wherein the said pump is adapted for recycling liquid product from a bath below and pumps it under pressure into said chamber and wherein the oblong sealed chamber(s) further comprise an electic-electronic drive unit that is adapted to generate direct current and operate the movement of said pairs of rollers, action of the pump and translation of the sheets in accordance with a program; and an electrode inside said oblong sealed chamber(s) and said pairs of contact rollers reciprocally electrically insulated and respectively connected to two poles of a direct current, supplied by the electric-electronic drive unit;

said liquid, pumped into the oblong sealed chamber(s) through nozzles, being projected, as said sheets pass between the rollers of the pairs of contact rollers onto areas of the sheets as they appear from between said pairs of contact rollers and therefore electro-plating on said sheets due to closure of an electric circuit generated by the direct current between said liquid and said sheets through said pairs of contact rollers.

2. A device as in claim 1, wherein:

said operative units are adapted to be positioned each after one pair of contact rollers and before said oblong sealed chamber(s) with respect to a forward movement of the metal sheets; and each operative unit comprises a first pair of containment rollers resting laterally one upon another through which the sheets similarly pass and said first pair containment rollers being drawn along in axial rotation reciprocally in opposite directions by mechanical means: and an upper roller is surrounded by a series of substantially equal rings placed side by side, whose internal diameter is greater than a diameter of said upper roller; and a second oblong chamber(s) is associated to said first oblong sealed chamber with nozzles, adapted to be positioned opposite to said first oblong sealed chamber (s) below said trajectory followed by the sheets in continuous translation wherein the second oblong chamber(s) comprises a nozzle with a narrow longitudinal slit contraposed to the set of tubular nozzles of the said first oblong sealed chamber(s) above and extending as far as a length of said set; and said second oblongs chamber(s) also are fed by said pump with liquid product recycled from the bath below and have inside an oblong laminar electrode connected to the same electric pole as that to which the electrode for the first oblong sealed chamber(s) is connected; and after said first and second oblong chamber(s) a second pair of containment rollers is provided; and the first oblong sealed chamber(s) are placed at a level higher than that of the first and second pairs of containment rollers; and the second oblong chamber(s) are placed at a level lower than an axis of the second pair of said first and second pairs of containment rollers.

3. A device as in claim 2, wherein:

a level and a reciprocal distance between longitudinal raised edges on an upper face of said second sealed chamber(s) are provided to ensure contact between surfaces of said lower rollers and said edges, thus forming an intermediate channel; and said channel has a base consisting of an upper face of said second sealed chamber(s) and sides consisting of opposing surfaces of said lower rollers of the first and second pairs of containment rollers, and said channel fills with liquid that comes out under pressure from the nozzle with slit for the second lower chamber(s).

4. A device as in claim 2, wherein:

rings on upper rollers of said first and second pairs of containment rollers rest spontaneously on surfaces of the advancing sheets create a channel a base of which is the sheets, lateral walls being external surfaces of said rings, which channel fills with active liquid emitted by the nozzles for said first oblong sealed chamber (s).

5. A device as in claim 1, wherein:

each operative unit comprises a pair of freely turning finishing rollers between the one or more pairs of contact rollers and the first and second pairs of containment rollers.

6. A device as in claim 1, wherein:

one or more pairs of contact rollers the pairs of rollers are respectively guided by supports formed of rectangular recesses made in opposite sides of a frame of the installation; and said recesses freely receive pins and cylindrical extensions of two ends of said pairs of one or more contact rollers so that the upper roller of each pair rests in weight on the lower roller and therefore on the metal sheets when they pass between the two rollers of each pair of contact rollers.

7. A device as in claim 1, further comprising a:

mechanism that rotates the one or more pairs of contact rollers comprises gear wheels fixed to ends of the lower rollers of said one are more pairs of contact rollers, that mesh with a continuous chain placed orthogonally to said rollers moved along by an electric motor; and two rollers of each pair of contact rollers are connected by equal gear wheels, rotation being assured of the upper rollers of the pairs of contact rollers even though slightly detached from the lower rollers due to passage between them of the metal sheets, since teeth of the gear wheels are longer than a thickness of said sheets.

8. A device as in claim 2, further comprising:

mechanisms that rotate the first and second pairs of containment rollers wherein the said mechanisms comprise helically toothed gear wheels fixed to one end, of lower rollers of said pairs of first and second containment rollers by gear wheels respectively meshing with helically toothed gear wheels fixed to a motor driven shaft orthogonal to said first and second pairs of containment rollers: and the two rollers of each pair are connected to substantially equal helically toothed gear wheels.

9. A device as defined in claim 1, wherein:

the pairs of contact rollers and laminar electrodes placed inside the chambers are electrically connected by electrical means, units respectively to negative and positive poles of the direct current.

10. Device as defined in claim 1, wherein:

in order to obtain electro-plating of a film on oblong sheets having raised edges of plastic material, the one or more pairs of contact rollers, finishing rollers and first and second containment rollers respectively present raised annular bands of a width corresponding to that of said oblong sheets between said edges and projecting to an extent greater than a height of said edges on two faces of said sheets; and internal and external diameters and a width of the rings on the first and second containment rollers are provided to permit said rings to rest spontaneously on both faces of the sheets and on their raised edges.

11. A device as in claim 10, wherein:

the film is of chemical tin.

12. A device as defined in claim 10, wherein:

the film is of chemical copper.

13. A device as defined in claim 10, wherein:

the contact rollers are of titanium.

14. A device as in claim 10, wherein:

the finishing rollers for finishing and the first and second containment rollers and the rings that surround said latter rollers are plastic.

* * * * *